(12) United States Patent
Wieduwilt et al.

(10) Patent No.: US 11,139,045 B2
(45) Date of Patent: Oct. 5, 2021

(54) MEMORY DEVICE WITH A MEMORY REPAIR MECHANISM AND METHODS FOR OPERATING THE SAME

(71) Applicant: Micron Technology, Inc., Boise, ID (US)

(72) Inventors: Christopher G. Wieduwilt, Boise, ID (US); James S. Rehmeyer, Boise, ID (US); Seth A. Eichmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/693,126

(22) Filed: Nov. 22, 2019

(65) Prior Publication Data

US 2021/0158888 A1    May 27, 2021

(51) Int. Cl.
   *G11C 7/00*       (2006.01)
   *G11C 29/44*      (2006.01)
   *G11C 29/02*      (2006.01)
   *G11C 29/00*      (2006.01)
   *H03M 13/11*      (2006.01)
   *G11C 11/409*     (2006.01)
   *H03M 13/13*      (2006.01)
   *G11C 29/18*      (2006.01)

(52) U.S. Cl.
   CPC ............ *G11C 29/44* (2013.01); *G11C 11/409* (2013.01); *G11C 29/027* (2013.01); *G11C 29/18* (2013.01); *G11C 29/789* (2013.01); *H03M 13/1105* (2013.01); *H03M 13/13* (2013.01)

(58) Field of Classification Search
   CPC ..................................................... G11C 29/70
   USPC ...................................................... 365/200
   See application file for complete search history.

(56) References Cited

U.S. PATENT DOCUMENTS

| | | | | |
|---|---|---|---|---|
| 2005/0232036 A1* | 10/2005 | Choi | .................... | G11C 29/781 365/200 |
| 2017/0017545 A1* | 1/2017 | Tanabe | ................ | H03M 13/373 |
| 2017/0372791 A1* | 12/2017 | Hatsuda | ................. | G11C 29/36 |

* cited by examiner

*Primary Examiner* — Hoai V Ho
(74) *Attorney, Agent, or Firm* — Perkins Coie LLP

(57) ABSTRACT

Methods, apparatuses and systems related to managing access to a memory device are described. A memory device includes fuses and latches for storing a repair segment locator and a repair address for each repair of one or more defective memory cells. A segment-address determination circuit generate an active segment address based on the repair address according to the repair segment locator and an address for a read or a write operation. A comparator circuitry is configured to determine whether the active segment address matches the address for the read or the write operation for replacing the one or more defective memory cells with the plurality of redundant cells when the address for the read/write operation corresponds to the one or more defective memory cells.

24 Claims, 11 Drawing Sheets

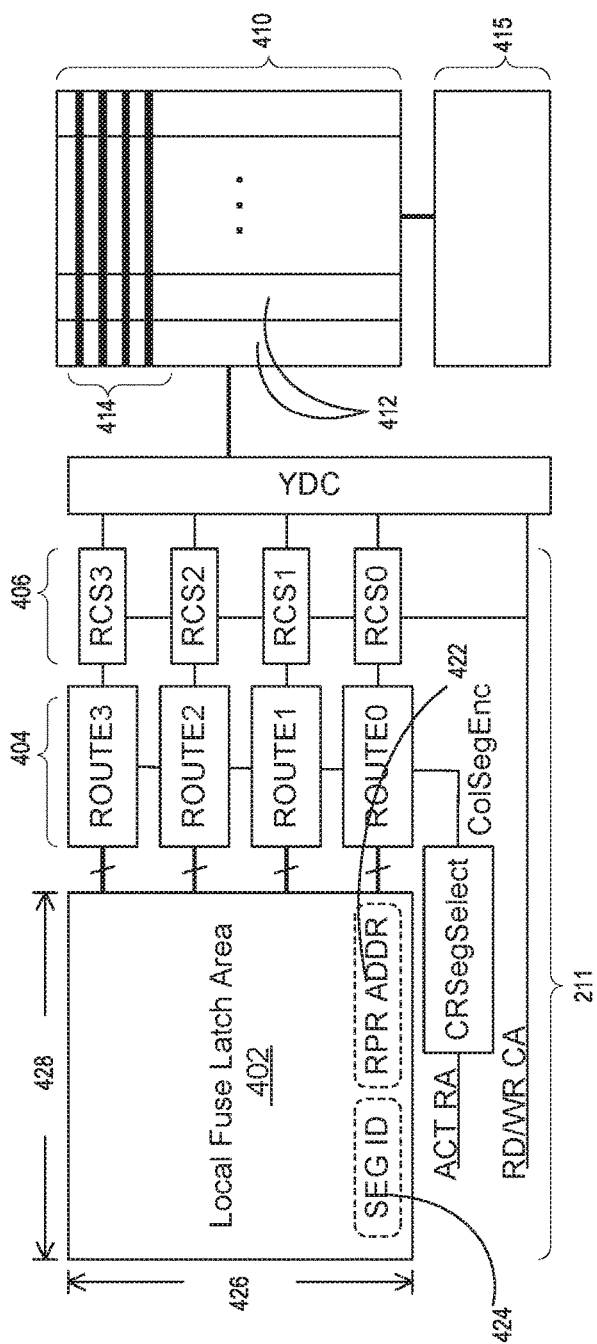
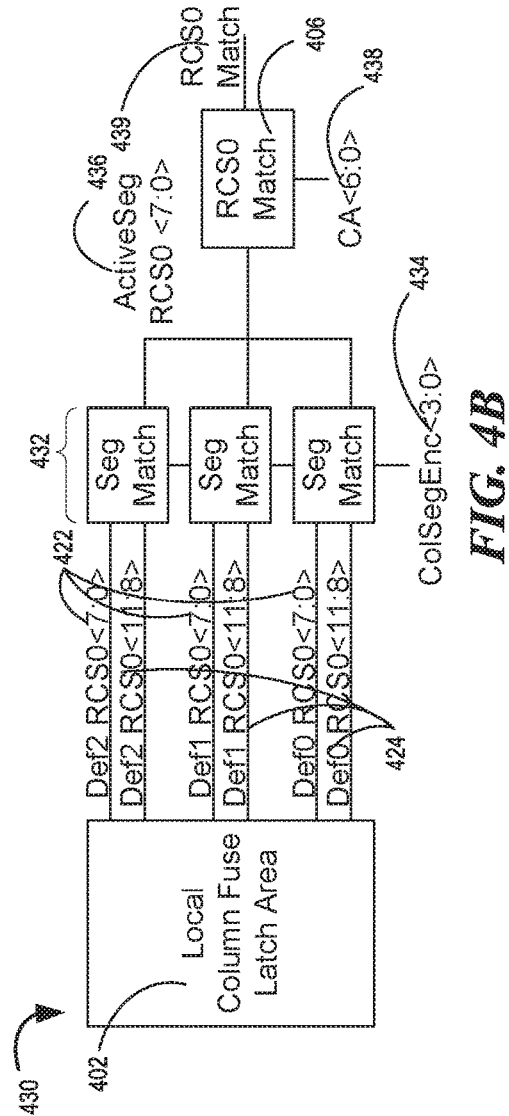
FIG. 4A
FIG. 4B

MEMORY DEVICE WITH A MEMORY REPAIR MECHANISM AND METHODS FOR OPERATING THE SAME

TECHNICAL FIELD

The disclosed embodiments relate to devices, and, in particular, to semiconductor memory devices with a memory repair mechanism and methods for operating the same.

BACKGROUND

Memory devices can include semiconductor circuits configured to utilize electrical energy to store and access information. Some examples of the memory devices include a volatile memory device, a non-volatile memory device, or a combination device.

Some memory devices (e.g., random-access memory (RAM), such as dynamic RAMs (DRAMs)) may include circuits configured to repair bit fails. FIG. 1 is a partial block diagram of a memory device 100 including a set of repairable memory cells. The memory device 100 includes repair circuit coupled to and/or integral with memory cells 102 and configured to repair/replace one or more defective cells 104 within the corresponding set of memory cells 102. The memory cells 102 include repair or redundant cells that are designated to replace the defective cells 104 as part of the repair circuit. In other words, the repair cells are configured to be back up memory cells that are not utilized in normal operations unless they are used to replace the actual/main memory cells 102. The repair cells are arranged in rows and columns (as, e.g., redundant rows 112 and redundant columns 114) similarly to the other memory cells 102.

In replacing the defective cells 104, the memory device 100 may implement row repairs and/or column repairs. For row repairs, the memory device 100 may deploy and utilize the redundant rows 112 to replace rows including the defective cells 104. As illustrated in FIG. 1, the memory device 100 may replace row R0, which contains the defective cell 104 therein, with a redundant row RR0. For column repairs, the memory device 100 may deploy and utilize the redundant columns 114 to replace columns including the defective cells 104. As illustrated in FIG. 1, the memory device 100 may replace column C0, which contains the defective cell 104 therein, with a redundant column RC1.

The repair circuit includes fuse blocks configured to facilitate the memory cell replacements. Each of the blocks include a set of fuse latches that is directly coupled (i.e., one-to-one dedicated and fixed electrical and functional connection) to a redundant row or a redundant column. The memory device 100 includes fuses or non-volatile memory (not shown) located in a fuse array on die. The information stored in the fuse array is broadcasted at initialization and loaded into the fuse blocks in each bank.

As illustrated in FIG. 1, the fuse blocks include row fuse blocks 122 that are each directly coupled to one of the redundant rows 112 and column fuse blocks 124 that are each directly coupled to one of the redundant columns 114. Each fuse block is configured to store addresses of the row/column including the defective cells 104. For example, when a redundant column is used to replace a defective column, the fuse block for the corresponding redundant column may be programmed (via, e.g., blowing/setting the fuse latches and/or associated fuses) to store the address of the defective column. The defective column can be effectively removed from operations of the memory device 100. Subsequently, the redundant column is used to store and provide access to data in place of the replaced defective column.

BRIEF DESCRIPTION OF THE DRAWINGS

FIG. 4A is a block diagram of a portion of the memory device in accordance with an embodiment of the present technology.

FIG. 4B is a detailed block diagram of a segment-address determination circuit in accordance with an embodiment of the present technology.

DETAILED DESCRIPTION

As described in greater detail below, the technology disclosed herein relates to an apparatus, such as a memory device, a memory system, a system with one or more memory devices, related methods, etc., for repairing memory cells. The apparatus includes a segment-address determination circuit that is between local fuse latches and an address decoder and is configured to allocate the fuses and repair memory cells according to defects. The local fuse latches can include additional fuses configured to store addresses of affected domains that include the defective cells. The segment-address determination circuit can use the domain address to replace the defective cells with redundant cells.

Conventional devices have repair fuse latch sets directly hard wired (i.e., dedicated one-to-one electrical and functional connections) to corresponding redundant memory cells. Accordingly, repair capabilities of such conventional devices are limited by the worst-performing repair region (e.g., portions within a memory array). Because of the unpredictability in failure, the repair fuse latch sets are included for every redundant element, such as for every redundant column and every redundant row, on the die. However, in typical settings, only a couple repair regions per die use all repairs, which leaves many (e.g., thousands or more) of repair elements and even more (e.g., tens of thousands) of fuse and fuse latches unused.

In contrast, the segment-address determination circuit allows the embodiments described below to associate the repair fuse latch sets with defects instead of the repair elements (e.g., redundant columns). Accordingly, the below-described embodiments can include reduced numbers of both fuse latches per bank logic and the size of the fuse array with minimal to no yield impact. The reduction can be accomplished by adding fuses and fuse latches that address the repair region or segment while reducing the number of fuse sets to match worst case defectivity, thereby resulting in a net fuse reduction.

Figure 2:
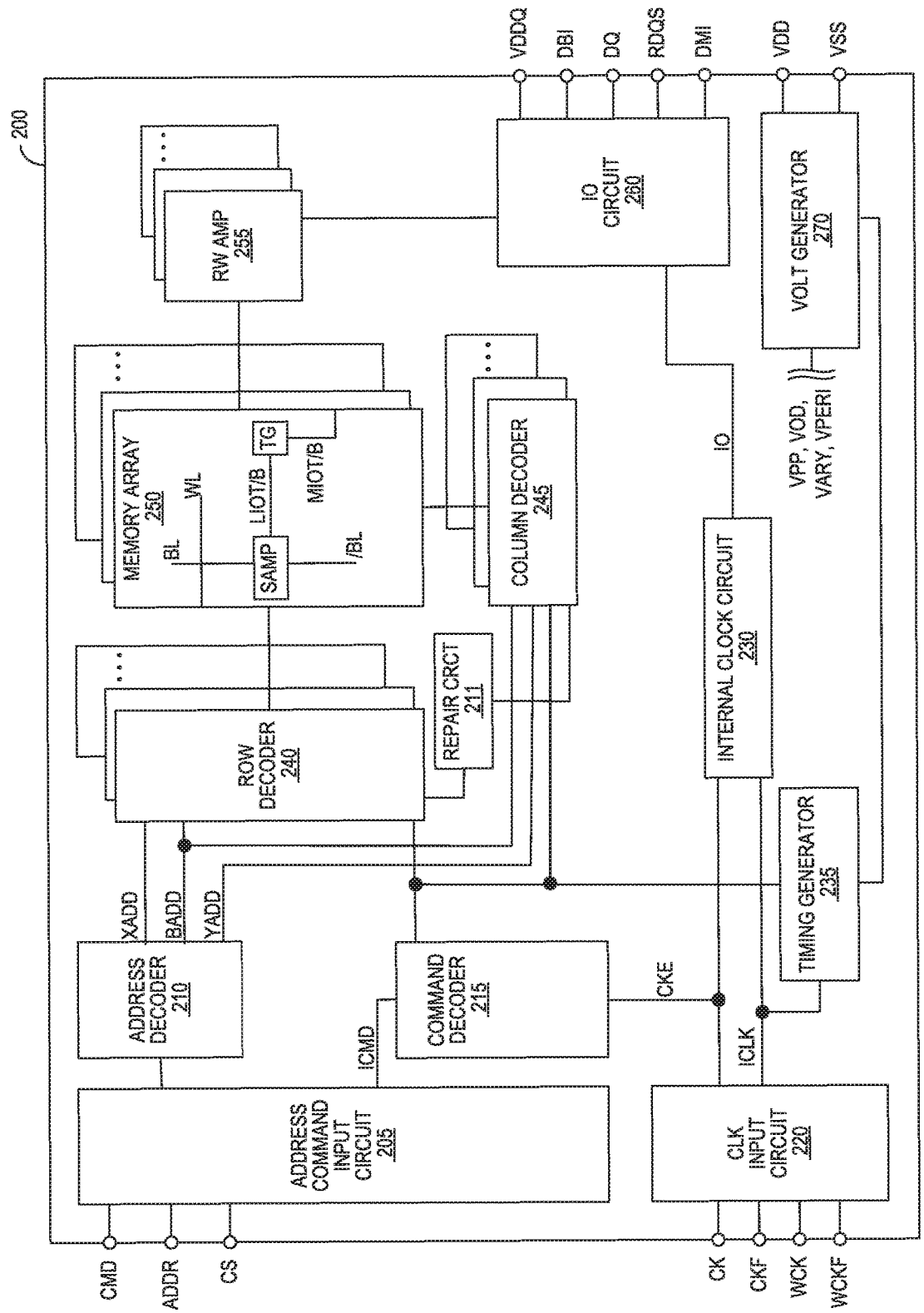
FIG. 2 is a block diagram of an example memory device in accordance with an embodiment of the present technology.

FIG. 2 is a block diagram of an example memory device 200 (e.g., a semiconductor die assembly, including a three-dimensional integration (3DI) device or a die-stacked package) in accordance with an embodiment of the present technology. For example, the memory device 200 can include a DRAM or a portion thereof that includes one or more dies/chips.

The memory device 200 may include an array of memory cells, such as memory array 250. The memory array 250 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 240, and the selection of a bit line BL may be performed by a column decoder 245. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 250 may also include plate lines and corresponding circuitry for managing their operation.

The memory device 200 may employ a plurality of external terminals that include command and address terminals coupled to a command bus and an address bus to receive command signals (CMD) and address signals (ADDR), respectively. The memory device 200 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 2) from outside. The address signal and the bank address signal supplied to the address terminals can be transferred, via a command/address input circuit 205, to an address decoder 210. The address decoder 210 can receive the address signals and supply a decoded row address signal (XADD) to the row decoder 240, and a decoded column address signal (YADD) to the column decoder 245. The address decoder 210 can also receive the bank address signal and supply the bank address signal to both the row decoder 240 and the column decoder 245.

The command and address terminals may be supplied with command signals (CMD), address signals (ADDR), and chip select signals (CS), from a memory controller and/or a nefarious chipset. The command signals may represent various memory commands from the memory controller (e.g., including access commands, which can include read commands and write commands). The chip select signal may be used to select the memory device 200 to respond to commands and addresses provided to the command and address terminals. When an active chip select signal is provided to the memory device 200, the commands and addresses can be decoded and memory operations can be performed. The command signals may be provided as internal command signals ICMD to a command decoder 215 via the command/address input circuit 205. The command decoder 215 may include circuits to decode the internal command signals ICMD to generate various internal signals and commands for performing memory operations, for example, a row command signal to select a word line and a column command signal to select a bit line. The command decoder 215 may further include one or more registers for tracking various counts or values (e.g., counts of refresh commands received by the memory device 200 or self-refresh operations performed by the memory device 200).

Read data can be read from memory cells in the memory array 250 designated by row address (e.g., address provided with an active command) and column address (e.g., address provided with the read). The read command may be received by the command decoder 215, which can provide internal commands to input/output circuit 260 so that read data can be output from the data terminals DQ, RDQS, DBI, and DMI via read/write amplifiers 255 and the input/output circuit 260 according to the RDQS clock signals. The read data may be provided at a time defined by read latency information RL that can be programmed in the memory device 200, for example, in a mode register (not shown in FIG. 2). The read latency information RL can be defined in terms of clock cycles of the CK clock signal. For example, the read latency information RL can be a number of clock cycles of the CK signal after the read command is received by the memory device 200 when the associated read data is provided.

Write data can be supplied to the data terminals DQ, DBI, and DMI according to the WCK and WCKF clock signals. The write command may be received by the command decoder 215, which can provide internal commands to the input/output circuit 260 so that the write data can be received by data receivers in the input/output circuit 260, and supplied via the input/output circuit 260 and the read/write amplifiers 255 to the memory array 250. The write data may be written in the memory cell designated by the row address and the column address. The write data may be provided to the data terminals at a time that is defined by write latency WL information. The write latency WL information can be programmed in the memory device 200, for example, in the mode register. The write latency WL information can be defined in terms of clock cycles of the CK clock signal. For example, the write latency information WL can be a number of clock cycles of the CK signal after the write command is received by the memory device 200 when the associated write data is received.

The power supply terminals may be supplied with power supply potentials VDD and VSS. These power supply potentials VDD and VSS can be supplied to an internal voltage generator circuit 270. The internal voltage generator circuit 270 can generate various internal potentials VPP, VOD, VARY, VPERI, and the like based on the power supply potentials VDD and VSS. The internal potential VPP can be used in the row decoder 240, the internal potentials VOD and VARY can be used in the sense amplifiers included in the memory array 250, and the internal potential VPERI can be used in many other circuit blocks.

The power supply terminal may also be supplied with power supply potential VDDQ. The power supply potential VDDQ can be supplied to the input/output circuit 260 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 260 so that power supply noise generated by the input/output circuit 260 does not propagate to the other circuit blocks.

The clock terminals and data clock terminals may be supplied with external clock signals and complementary external clock signals. The external clock signals CK, CKF, WCK, WCKF can be supplied to a clock input circuit 220. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 220 can receive the external clock signals. For example, when enabled by a clock/enable signal from the command decoder 215, an input buffer can receive the clock/enable signals. The clock input circuit 220 can receive the external clock signals to generate internal clock signals ICLK. The internal clock signals ICLK can be supplied to an internal clock circuit 230. The internal clock circuit 230 can provide various phase and frequency controlled internal clock signals based on the received internal clock signals ICLK and a clock enable (not shown in FIG. 2) from the command/address input circuit 205. For example, the internal clock circuit 230 can include a clock path (not shown in FIG. 2) that receives the internal clock signal ICLK and provides various clock signals to the command decoder 215. The internal clock circuit 230 can further provide input/output (IO) clock signals. The IO clock signals can be supplied to the input/output circuit 260 and can be used as timing signals for determining output timing of read data and/or input timing of write data. The IO clock signals can be provided at multiple clock frequencies so that data can be output from and input to the memory device 200 at different data rates. A higher clock frequency may be desirable when high memory speed is desired. A lower clock frequency may be desirable when lower power consumption is desired. The internal clock signals ICLK can also be supplied to a timing generator 235 and thus various internal clock signals can be generated.

The memory device 200 can be connected to any one of a number of electronic devices capable of utilizing memory for the temporary or persistent storage of information, or a component thereof. For example, a host device of memory device 200 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 200; although in other embodiments, the host device may be indirectly connected to memory device (e.g., over a networked connection or through intermediary devices).

The memory device 200 can include repair circuitry 211, which can be coupled to one or more address decoders, such as the address decoder 210, the row decoder 240, and/or the column decoder 245. The repair circuit 211 can be configured to repair defects in storage cells. For example, the repair circuit 211 can replace defective memory cells with redundant memory cells in the memory array 250. As described in further detail below, the repair circuit 211 can include fuses and local fuse latches configured to store location information (e.g., addresses and/or affected domain identifiers) associated with the defective memory cell. The repair circuit 211 can further include a segment-address determination circuit configured to apply the redundant memory cells and/or the addresses stored within the fuses according to the location information. As such, the fuses can be utilized across domains (e.g. column domains) within the memory array 250, such as by being connected/assigned to different redundant cells/domains instead of being limited to dedicated connections. Thus, the number of repairs, fuses, and fuse latches may be reduced to account for realistic failure rates, thereby reducing resources and/or device footprint associated with the repairs, fuses, latches, etc.

Figure 3A:
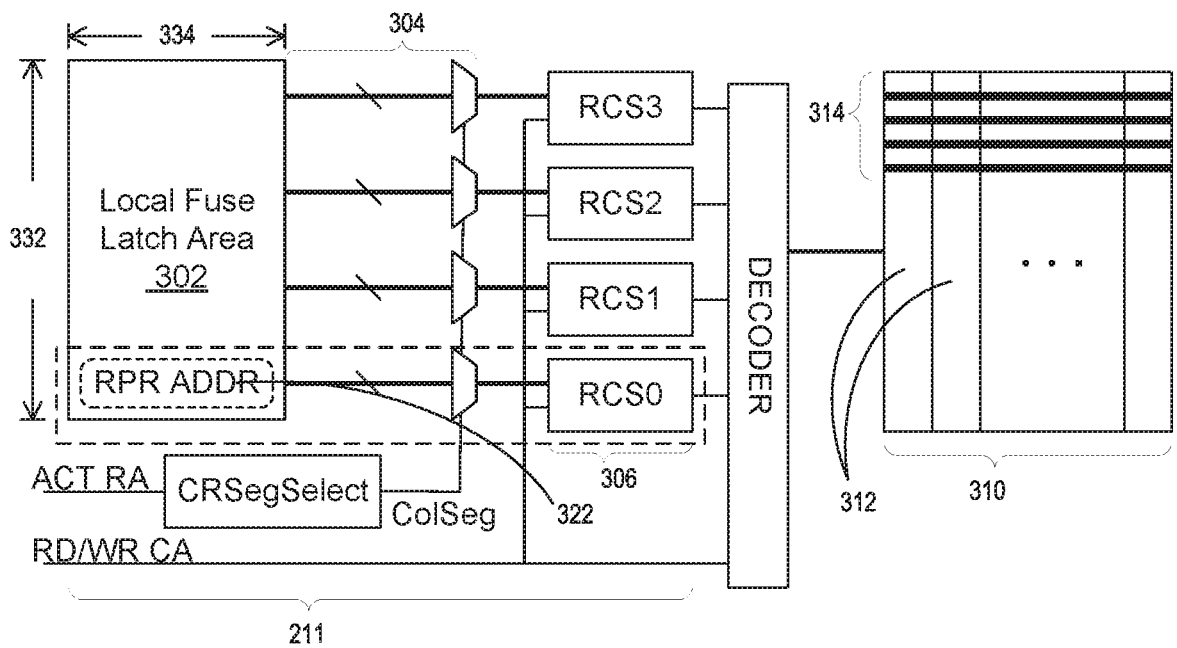
FIG. 3A is a block diagram of a portion of the memory device of FIG. 2 in accordance with an embodiment of the present technology.

FIG. 3A is a block diagram of a portion of the memory device 200 of FIG. 2 in accordance with an embodiment of the present technology. For example, FIG. 3A illustrates the repair circuit 211, a location decoder (e.g., the column decoder 245 of FIG. 2) and a portion of the memory array 250 of FIG. 2. In some embodiments, the repair circuit 211 can include a local fuse latch area 302 coupled to selection circuits 304 and comparator circuitry 306. In some embodiments, the memory device 200 can include a grouping of one selection circuit 304 and one comparator circuit 306 for each redundant memory grouping (e.g., for each redundant column or row).

The local fuse latch area 302 can include fuse latches and/or fuses configured to store/latch location information (e.g., addresses) associated with the repair. The selection circuits 304 can include circuitry configured to select the repair location/address that corresponds to the current read/write operation. The comparator circuitry 306 can compare an incoming address (e.g., a read or a write address from a host) to the latched addresses for any matches. An output of the comparator circuitry 306 can be used by the location decoder for accessing the targeted location within a regional plane 310 (e.g., a portion of the memory array 250, such as a region within one of the arrays). The regional plane 310 can include the memory cells that are grouped according to function or purpose. For example, the memory array 250 includes segments 312 (e.g., column and/or row segments) and/or redundant memory 314 (e.g. redundant columns and/or redundant rows).

As an illustrative example, information stored in the fuses (e.g., addresses associated with repairs) can be loaded or latched into corresponding latches in the local fuse latch area 302. Accordingly, the local fuse latch area 302 can store repair addresses 322 (e.g., address of the original memory cells, such as a column, that includes one or more defective cells). The selection circuit 304 can select one of the repair addresses 322 (corresponding redundant memory 314, such as one of the redundant columns) associated with the segment 312 that is active for the current read/write operation. In some embodiments, the selection includes selecting one of the direct connections that tie the fuse latches to the redundant memory 314 for each of the segments 312.

Using column repairs as an illustrative example, the repair addresses 322 can represent memory columns that include one or more defective cells. The selection circuit 304 and the comparator circuitry 306 can use the repair addresses to determine when read or write operations target the defective memory columns. In some embodiments, the selection circuit 304 can receive a column segment identifier (e.g., an output of a column-row segment selection circuit (CRSegSelect)) based on active row address (ACT RA) associated with the read or write command. The comparator circuitry 306 can receive the output of the selection circuit 304 (e.g., a repaired out main array column select) and the read/write column address (RD/WR CA) for comparison. The comparator circuitry 306 can generate a flag when the RD/WR CA (e.g., address of the defective columns) matches the output of the selection circuit 304 (e.g., the repair address 322). The decoder can use the output of the comparator to access the redundant columns assigned to replace the defective columns for the read or write instead of the defective columns themselves.

To facilitate the repair, the local fuse latch area 302 can include a number of fuses and/or fuse latches that correspond to a first measure 332 and a second measure 334. For example, the first measure 332 can correspond to a number of segments and/or a number of available repairs (e.g., redundant columns). In one example embodiment, an array region (e.g., a bank, a die, and/or an array) can correspond to 1 Gb of memory or more. The memory cells in the array region can be further configured as four column planes (e.g., four instances of the regional plane 310) that each include four redundant columns. Each column plane can include 10 column segments, which in some embodiments can be decoded by RA <15:4>. Based on such configuration, four repairs may be available for each column segment (i.e., 40 repairs for each column plane and 160 per bank). Accordingly, the first measure 332 can correspond to the total number repairs available for the column plane (e.g., 40 repairs). In other words, the first measure 332 can correspond to the number of fuse latch sets that each correspond to a repair. Also, the second measure 334 can correspond to an amount of information (e.g., a number of bits) needed for each repair. In some embodiments, the second measure 334 can correspond to eight bits (i.e., seven column address bits and one enable bit) of the repair address 322. Thus, the local fuse latch area 302 can include 40 fuse latch sets that each include eight latches (i.e., 320 total fuse latches).

Figure 3B:
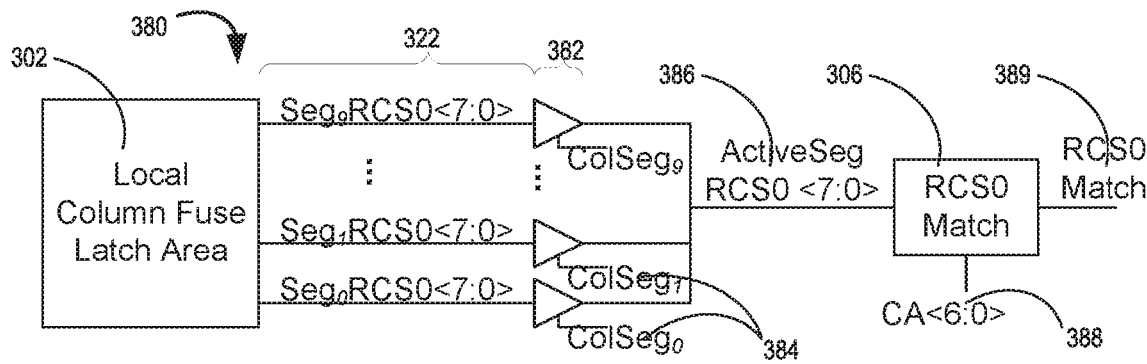
FIG. 3B is a detailed block diagram of a selection circuit in accordance with an embodiment of the present technology.
Figure 3C:
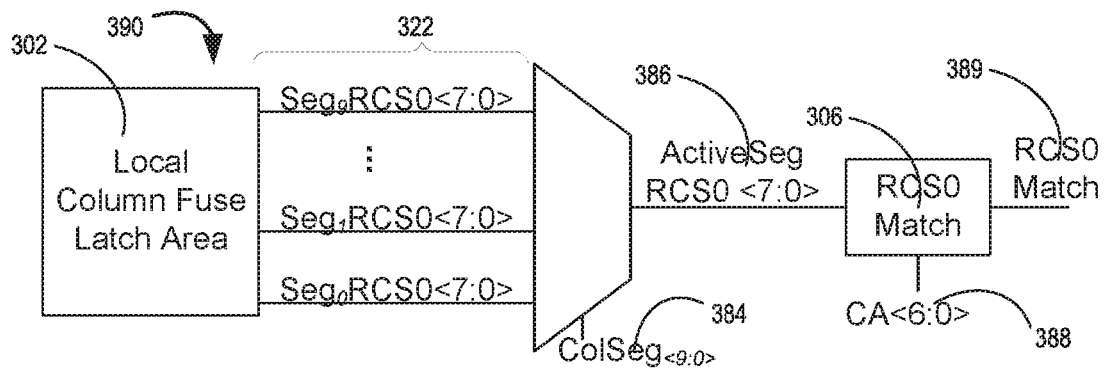
FIG. 3C is a detailed block diagram of a selection circuit in accordance with an embodiment of the present technology.

In some embodiments, a repair fuse set maybe included for each redundant column select (RCS) (e.g., each redundant column) in each column segment. Read addresses can be decoded to a hot bus that represents the segment including the active row. The corresponding fuse set can be multiplexed to the RCS match for column time comparison. To illustrate details of the selection circuit 304 and the comparator circuitry 306, FIG. 3B and FIG. 3C are block diagrams of a portion (e.g., the selection circuit 304 and the comparator circuitry 306) of the memory device 200 in accordance with embodiments of the present technology. For example, FIG. 3B illustrates a control circuit 380 (e.g., the selection circuit 304, the comparator circuitry 306, and/or portions thereof) that includes buffers 382 for controlling an assignment or a repair using a redundant column RCS0.

As discussed above, the local (column) fuse latch area 302 can include 10 instances of the repair address 322 (i.e., one repair address for each column segment 312) that are each eight bits long. Each of the repair addresses 322 ($Seg_{1-9}$ RCS0<7:0>) can be received by one of the buffers 382. Each of the buffers 382 are controlled by column segment identifiers 384 (e.g., an output of a column-row segment selection circuit (CRSegSelect)) that identifies the column segment associated with the read/write address. In other words, the column segment identifiers 384 can be active when the address for the read/write operations are associated with the corresponding column sections. Accordingly, the selection circuit 304 can generate an active segment address 386 (ActiveSeg RCS0 <7:0>) as the repair address 322 that is associated with the column section targeted by the read/write command. The comparator circuitry 306 can receive and compare the active segment address 386 with a read/write column address 388 (CA<6:0>) to generate a match flag 389 for the redundant column RCS0. As described above, the column decoder can access the redundant column RCS0 in place of the replaced column indicated by the read/write column address 388.

Also, FIG. 3C illustrates a control circuit 390 (e.g., the selection circuit 304, the comparator circuitry 306, and/or portions thereof) that includes a multiplexer 392 for controlling an assignment or a repair using a redundant column RCS0. Similar to the control circuit 380, the control circuit 390 can correspond to 10 instances of the repair address 322. The repair addresses 322 can be received by the multiplexer 392. The multiplexer 392 can be controlled by the column segment identifiers 384 (ColSeg<9:0>) to generate the active segment address 386. In other words, the multiplexer 392 can generate the active segment address 386 by selecting one of the repair addresses 322 according to the column segment identifiers 384. As described above, the comparator circuitry 306 can generate the match flag 389 based on comparing the active segment address 386 the read/write column address 388.

FIG. 4A is a block diagram of a portion of the memory device 200 of FIG. 2 in accordance with an embodiment of the present technology. For example, FIG. 4A illustrates the repair circuit 211, a location decoder (e.g., the column decoder 245 of FIG. 2) and a portion of the memory array 250 of FIG. 2. In some embodiments, the repair circuit 211 can include a local fuse latch area 402 coupled to segment-address determination circuits 404 that include comparator circuitry 406. In some embodiments, the memory device 200 can include a grouping of one selection circuit 304 and one comparator circuit 306 for each redundant memory grouping (e.g., for each redundant column or row).

The local fuse latch area 402 can include fuse latches and/or fuses configured to store/latch location information (e.g., addresses) associated with the repair. The segment-address determination circuits 404 can include circuitry configured to determine a replacement/defective location according to a section (e.g., one of the regional planes, such as a column plane) including the defect. The comparator circuitry 406 can compare an incoming address (e.g., a read or a write address from a host) to the latched addresses for any matches. An output of the comparator circuitry 406 can be used by the location decoder for accessing the targeted location within a regional plane 410 (e.g., a portion of the memory array 250, such as a region within one of the arrays). The regional plane 410 can include the memory cells that are grouped according to function or purpose. For example, the memory array 250 includes segments 412 (e.g., column and/or row segments) and/or redundant memory 414 (e.g. redundant columns and/or redundant rows). Also, the memory array 250 may include one or more repair planes 415 (e.g., dedicated column planes) including redundant memory cells designated for global repairs. The memory device 200 can similarly use the comparator circuitry 406 or a derivation thereof in implementing the global repairs and swapping memory inputs/outputs (MIOs) from the repair planes 415 with the repaired out main array plane (e.g., defective column plane) in the data path.

As an illustrative example, information stored in the fuses (e.g., addresses associated with repairs) can be loaded or latched into corresponding latches in the local fuse latch area 402. Accordingly, the local fuse latch area 402 can store repair addresses 422 (e.g., address of the original memory cells, such as a column, that includes one or more defective cells). The local fuse latch area 402 can further include repair segment locators 424 that each corresponds to one of the repair addresses 422. The repair segment locators 424 can identify the segment 412 associated with the corresponding repair address 422. Using the repair segment locators 424, the segment-address determination circuit 404 can determine the repair addresses 422 according to the segment 412 that is active for the current read/write operation. In other words, the repair segment locators 424 represent fuses addresses indicating the segment 412 for each fuse and fuse latch set.

Using column repairs as an illustrative example, the repair addresses 422 can represent memory columns that include one or more defective cells. Accordingly, the segments 412 can represent column segments/domains. The repair segment locators 424 can each identify the column segments that includes the defective column replaced by the redundant memory. As described in detail below, the segment-address determination circuit 404 and the comparator circuitry 406 can use the repair addresses 422 and the repair segment locators 424 to determine when reads or writes target the corresponding defective memory columns. In some embodiments, the segment-address determination circuit 404 can receive a column segment identifier (e.g., an output of a column-row segment selection circuit (CRSegSelect)) based on active row address (ACT RA) associated with the read or write command. The comparator circuitry 406 can receive the output of the segment-address determination circuit 404 (e.g., a redundant column select (RCS) address associated with the column segment corresponding to the reader write command) and the read/write column address (RD/WR CA) for comparison. The comparator circuitry 406 can generate a flag when the RD/WR CA (e.g., address of the defective columns) matches the output of the segment-address determination circuit 404 (e.g., the repair address 422). The decoder can use the output of the comparator to access the redundant columns assigned to replace the defective columns for the read or write instead of the defective columns themselves.

To facilitate the repair, the local fuse latch area 402 can include a number of fuses and/or fuse latches that correspond to a first measure 426 and a second measure 428. For example, the first measure 426 can correspond to a number of segments and/or a number of available repairs and the second measure 428 can correspond to an amount of information (e.g., a number of bit) necessary for each repair. Based on the repair segment locators 424, the second measure 428 can be greater than the second measure 334 of FIG. 3A. However, since the fuses and/or the fuse latches can be directed to different column planes, the total number of repairs may be reduced to match realistic failure rates rather than all possible failure scenarios. Thus, the first measure 426 can be lesser than the first measure 332 of FIG. 3A and reduce the total number of fuses, fuse latches, and/or repairs.

In one example embodiment, an array region (e.g., a bank) can correspond to 1 Gb of memory. The memory cells in the array region can be further configured as four column planes (e.g., four instances of the regional plane 410) that each include four redundant columns. Each column plane can include 10 column segments, which in some embodiments can be decoded by RA <15:4>. Based on the repair segment locators 424 the segment-address determination circuit 404, the repairs can be independent of (i.e., not directly tied to) the column segments. Accordingly, the first measure 426 can be 10 or less (representing, e.g., three or four repairs for each column plane and 12 or 16 per bank), which is less than the first measure 332 corresponding to the 40 repairs (i.e., repairs four redundant columns and 10 column segments) described above for the example illustrated in FIG. 3A.

The increase in the second measure 428 (e.g., in comparison to the example illustrated in FIG. 3A) can correspond to the number of column segments. For example, the repair segment locator 424 can be four bits long to identify 10 unique column segments. When the repair addresses 422 are eight bits long as described above, the second measure 428 can be 12 bits. However, the increase in the second measure 428 can be offset by the decrease in the first measure 426, thereby reducing the total number of fuses and/or fuse elements in the local fuse latch area 402. For example, the first measure 426 can be reduced to 12 fuse latch sets (i.e., 12 repairs) that enable up to four repairs and any segment, up to 12 repairs per region, and/or 48 repairs per bank. Since each repair requires 12 bits, the local fuse latch area 402 can include 144 total latches instead of the 320 total fuse latches in the local fuse latch area 302 of FIG. 3A.

Figure 4C:
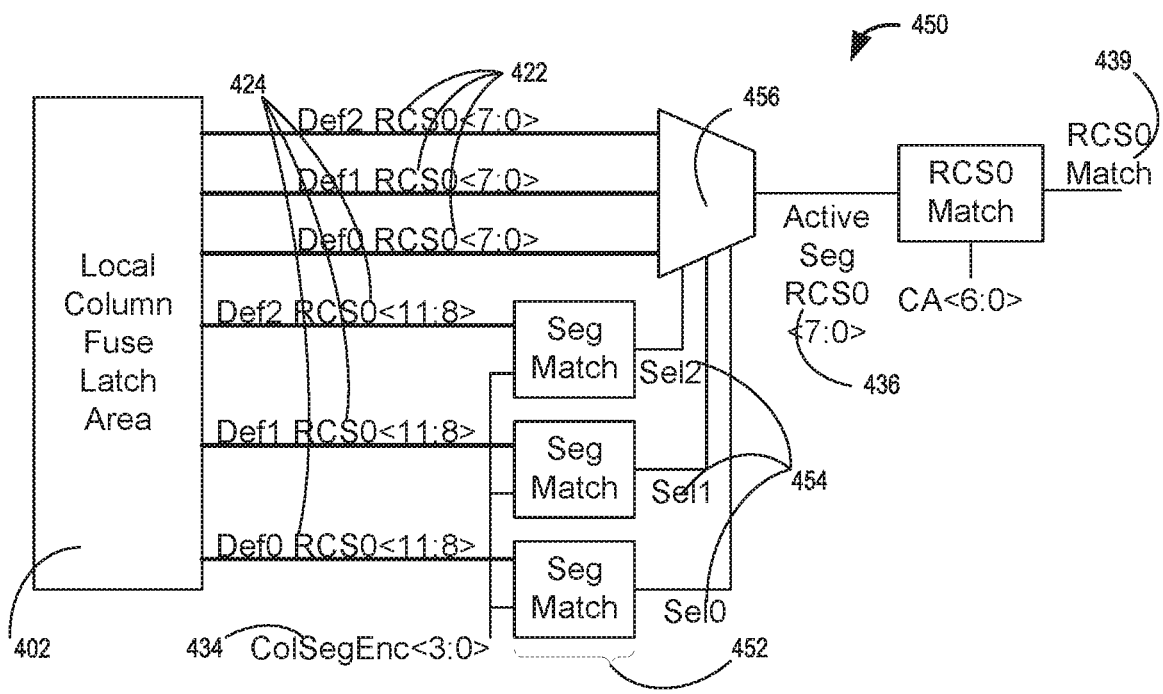
FIG. 4C is a detailed block diagram of a segment-address determination circuit in accordance with an embodiment of the present technology.

To illustrate details of the segment-address determination circuit 404 and the comparator circuitry 406, FIG. 4B, FIG. 4C, FIG. 4D, and FIG. 4E are block diagrams of a portion (e.g., the segment-address determination circuits 404 and the comparator circuitry 406) of the memory device 200 in accordance with embodiments of the present technology. For example, FIG. 4B illustrates a control circuit 430 (e.g., the segment-address determination circuit 404, the comparator circuitry 406, and/or portions thereof) that includes segment match circuits 432 for controlling an assignment or a repair using a redundant column RCS0.

As discussed above, the local (column) fuse latch area 402 can include a reduced number of the repair addresses 422 (Def0-2 RCS0 <7:0>) that each have a corresponding repair segment locator 424 (Def0-2 RCS0 <11:8>). Each of the segment match circuits 432 (e.g., comparator circuitry) can receive one repair address 422 and one repair segment locator 424 that correspond to a defective memory location.

The segment match circuits 432 can receive column segment identifier 434 (ColSegEnc<3:0>) (e.g., an output of a column-row segment selection circuit (CRSegSelect)) that identifies the column segment associated with the read/write address. The segment match circuits 432 can generate an active segment address 436 (ActiveSeg RCS0 <7:0>) for a redundant column (e.g., RCS0) according to the column segment identifier 434. For example, the segment match circuits 432 can output the repair address 422 as the active segment address 436, such as at row time, when the paired repair segment locator 424 (e.g., 4 fused ColSeg bits) matches the column segment identifier 434 (ColSegEnc). In other words, the active segment address 436 can be the repair address 422 that is associated with the column section targeted by the read/write command. The comparator circuitry 406 can receive and compare the active segment address 436 with a read/write column address 438 (CA<6:0>) to generate a match flag 439 for the redundant column. As described above, the column decoder can access the redundant column in place of the replaced column indicated by the read/write column address 438.

FIG. 4C illustrates a control circuit 450 (e.g., the segment-address determination circuit 404, the comparator circuitry 406, and/or portions thereof) that includes a multiplexer 456 for controlling an assignment or a repair using a redundant column (e.g., RCS0). The control circuit 450 can be similar to the control circuit 430 of FIG. 4B described above. For example, the local (column) fuse latch area 402 can include a reduced number of the repair addresses 422 (Def0-2 RCS0 <7:0>) that each have a corresponding repair segment locator 424 (Def0-2 RCS0 <11:8>). Also, the comparator circuitry 406 can receive the active segment address 436 (ActiveSeg RCS0 <7:0>) and compare it with the read/write column address 438 (CA<6:0>). Based on the comparison, the comparator circuitry 406 can generate the match flag 439 for the redundant column.

The control circuit 450 can include segment match circuits 452 for controlling an assignment or a repair using a redundant column (e.g., RCS0). Each of the segment match circuits 452 (e.g., comparator circuitry) can receive one repair segment locator 424 that corresponds to a defective memory location and the column segment identifier 434 (ColSegEnc<3:0>) for comparison. Based on the comparison, the segment match circuits 452 can generate one or more selection signals 454 that indicate whether one or more of the repair segment locators 424 corresponds to the column segment identifier 434. For example, each of the segment match circuits 452 can generate a unique selection signal 454 that indicates whether the received repair segment locator 424 matches the column segment identifier 434.

The control circuit 450 can further include a multiplexer 456 that receives the repair addresses 422 along with the selection signals 454. The multiplexer 456 can be configured to generate the active segment address 436 according to the selection signals 454. For example, the multiplexer 456 can generate the active segment address 436 is one of the repair addresses 422 that matches the repair segment locator 424 indicated by the selection signal 454. In other words, segment match circuits 452 can identify which of the repair segment locator 424 corresponds to the current row address and generate selection signals 454 accordingly. The multiplexer 456 can transmit one of the repair addresses 422 that matches the repair segment locator 424 indicated by the selection signal 454.

In some embodiments, the multiplexer 456 can be configured to handle a no match case (e.g., when the current read/write address is unrelated to the segments associated with the stored addresses). For example, the multiplexer 456 can precharge or implement a weak pull-up or pulldown on the Active Seg enable fuse/bit switch (via. e.g., an enable XOR) such that the RCS match is disabled if none of the defects match the segment. The multiplexer 456 can generate an output default set according to a NOR of the selection signals 454. For the no match case, the output of the NOR can be routed to the comparator circuitry 406 and force a match disable.

Figure 4D:
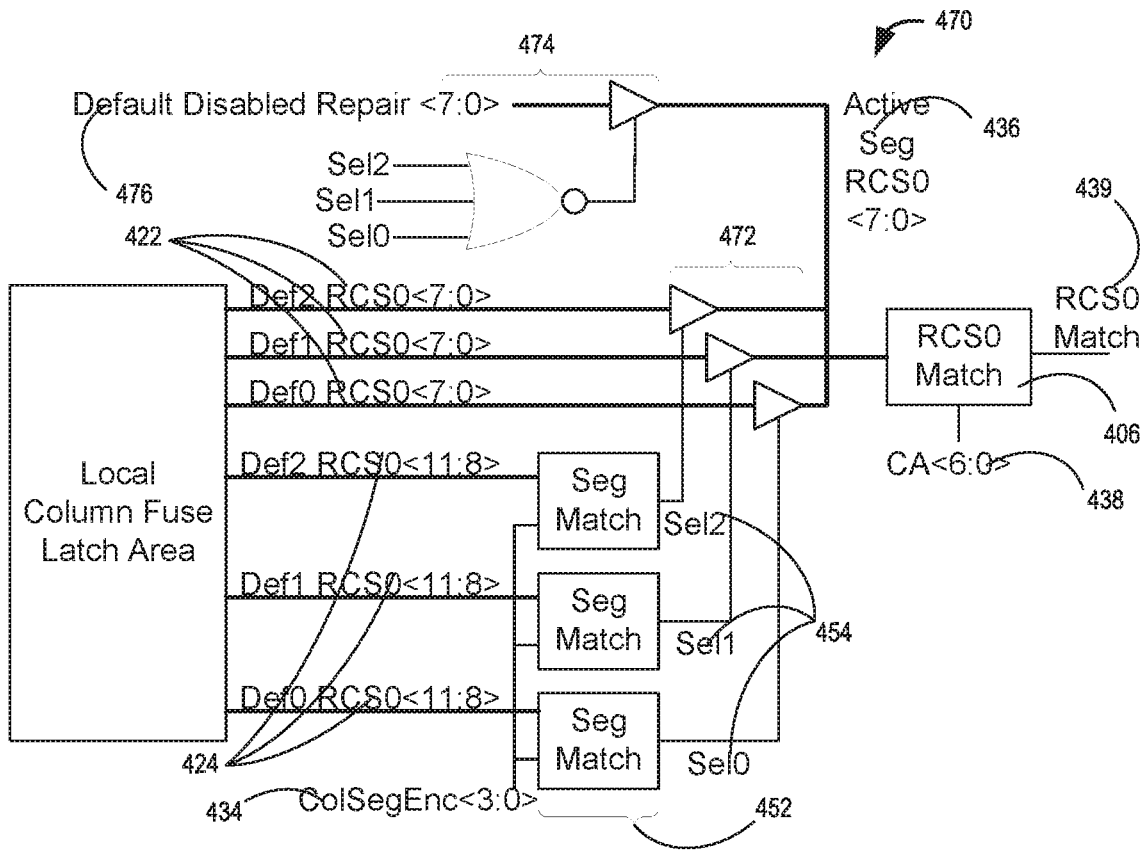
FIG. 4D is a detailed block diagram of a segment-address determination circuit in accordance with an embodiment of the present technology.

FIG. 4D illustrates a control circuit 470 (e.g., the segment-address determination circuit 404, the comparator circuitry 406, and/or portions thereof) that includes buffers 472 for controlling an assignment or a repair using a redundant column (e.g., RCS0). The control circuit 470 can be similar to the control circuit 450 of FIG. 4C described above. For example, the control circuit 470 can include the segment match circuits 452 that generate selection signals 454 based on comparing the repair segment locators 424 with the column segment identifier 434 as described above. Also, the comparator circuitry 406 can receive the active segment address 436 (ActiveSeg RCS0 <7:0>) and compare it with the read/write column address 438 (CA<6:0>). Based on the comparison, the comparator circuitry 406 can generate the match flag 439 for the redundant column.

In some embodiments, the control circuit 470 can include the buffers 472 configured to generate the active segment address 436 according to the selection signals 454. Each of the buffers 472 can receive one of the repair addresses 422 and be controlled by one of the selection signals 454. Accordingly, the buffers 472 can generate the active segment address 436 based on releasing or transmitting one or more of the repair addresses according to the selection signals 454. In other words, segment match circuits 452 can identify which of the repair segment locator 424 corresponds to the current read/write address and generate selection signals 454 accordingly. The buffers 472 can transmit one of the repair addresses 422 that matches the repair segment locator 424 indicated by the selection signal 454.

In some embodiments, the control circuit 470 can include a repair disable circuit 474 that is configured to handle a no match case (e.g., when the current read/write address is unrelated to the segments associated with the stored addresses). For example, the repair disable circuit 474 can include a buffer that receives a default disabled repair address 476 coupled to or controlled by a NOR gate that receives the selection signals 454. The repair disable circuit 474 can precharge or implement a weak pull-up or pulldown on the Active Seg enable fuse/bit switch (via, e.g., the enable XOR) such that the RCS match is disabled if none of the defects match the segment. The repair disable circuit 474 can generate the default disabled repair address 476 (e.g., for the no match case) according to a NOR of the selection signals 454.

Figure 4E:
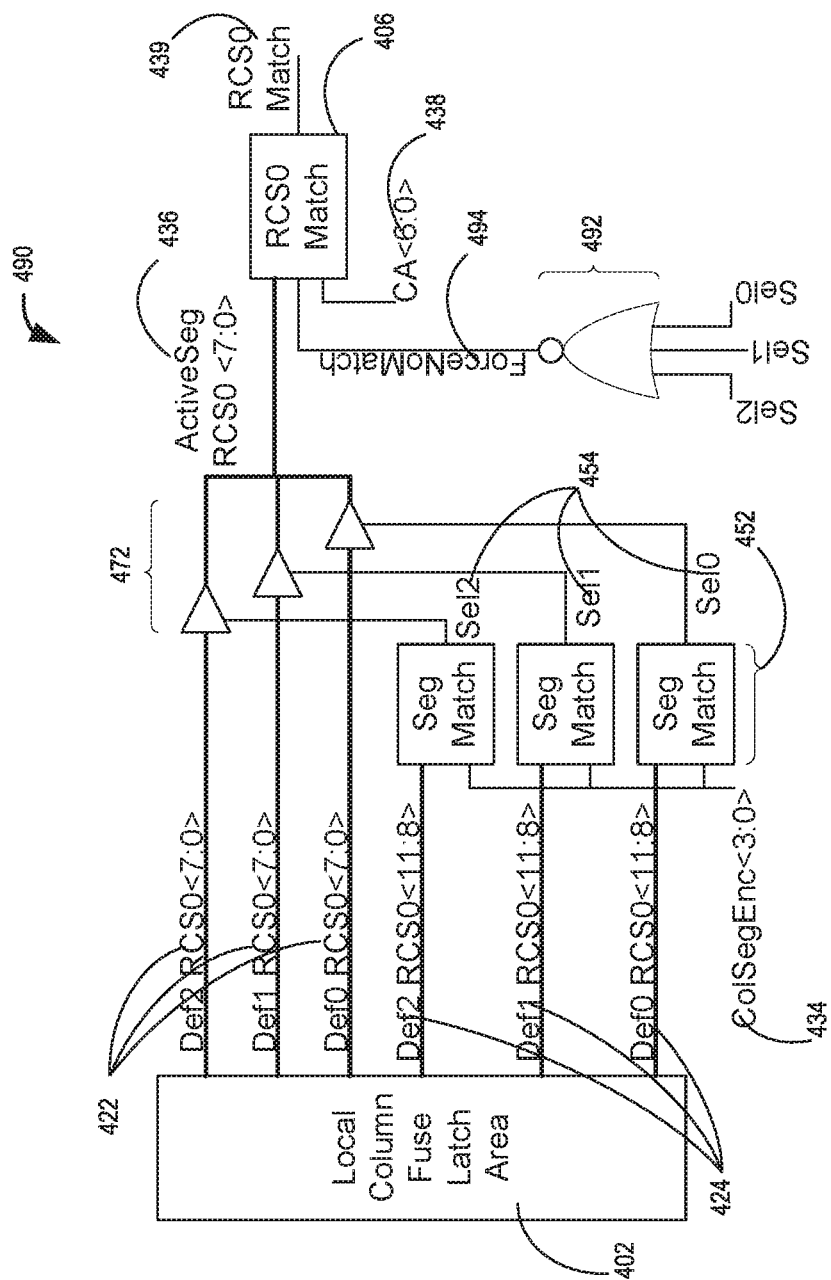
FIG. 4E is a detailed block diagram of a segment-address determination circuit in accordance with an embodiment of the present technology.

FIG. 4E illustrates a control circuit 490 (e.g., the segment-address determination circuit 404, the comparator circuitry 406, and/or portions thereof) that includes the buffers 472 for controlling an assignment or a repair using a redundant column (e.g., RCS0). The control circuit 490 can be similar to the control circuit 450 of FIG. 4C and/or the control circuit 470 of FIG. 4D described above. For example, the control circuit 490 can include the segment match circuits 452 that generate selection signals 454 based on comparing the repair segment locators 424 with the column segment identifier 434 as described above. Also, the comparator circuitry 406 can receive the active segment address 436 (ActiveSeg RCS0 <7:0>) and compare it with the read/write column address 438 (CA<6:0>). Based on the comparison, the comparator circuitry 406 can generate the match flag 439 for the redundant column. The control circuit 490 can further include the buffers 472 (or alternatively the multiplexer 456 of FIG. 4C) configured to generate the active segment address 436 according to the selection signals 454.

In some embodiments, the control circuit 490 can include a repair disable circuit 492 that generates a no match signal 494 according to the selection signals 454. The repair disable circuit 492 can be similar to the repair disable circuit 474 of FIG. 4D, but provide a separate signal (the no match signal 494) instead of providing the default disabled repair address 476 of FIG. 4D as the active segment address 436. For example, the repair disable circuit 492 can be a NOR gate that generates the no match signal 494 as a NOR of the selection signals 454. The no match signal 494 can indicate the no match case to the comparator circuitry 406. Accordingly, the comparator circuitry 406 can deactivate the match flag 439 to indicate the no match based on an active state of the no match signal 494, independent of the active segment address 436.

The segment-address determination circuit 404 and/or the repair disable circuit 474/494 provide reduced resources and reduced circuit foot print for the memory device 200 of FIG. 2. The number and/or size of the multiplexer, routing, and the logic associated with the fuse latch sets can be reduced along with the reduction in the number of fuse latch sets. Using the examples discussed above (e.g., for FIG. 3A and FIG. 4A), the segment-address determination circuit 404 and/or the repair disable circuit 474/494 can reduce the number and/or size of the multiplexer, routing, and the logic from a factor of 10 (e.g., for 10 fuse latch set example of FIG. 3A) to three (e.g., for 3 fuse latch set example of FIG. 4A).

Figure 5A:
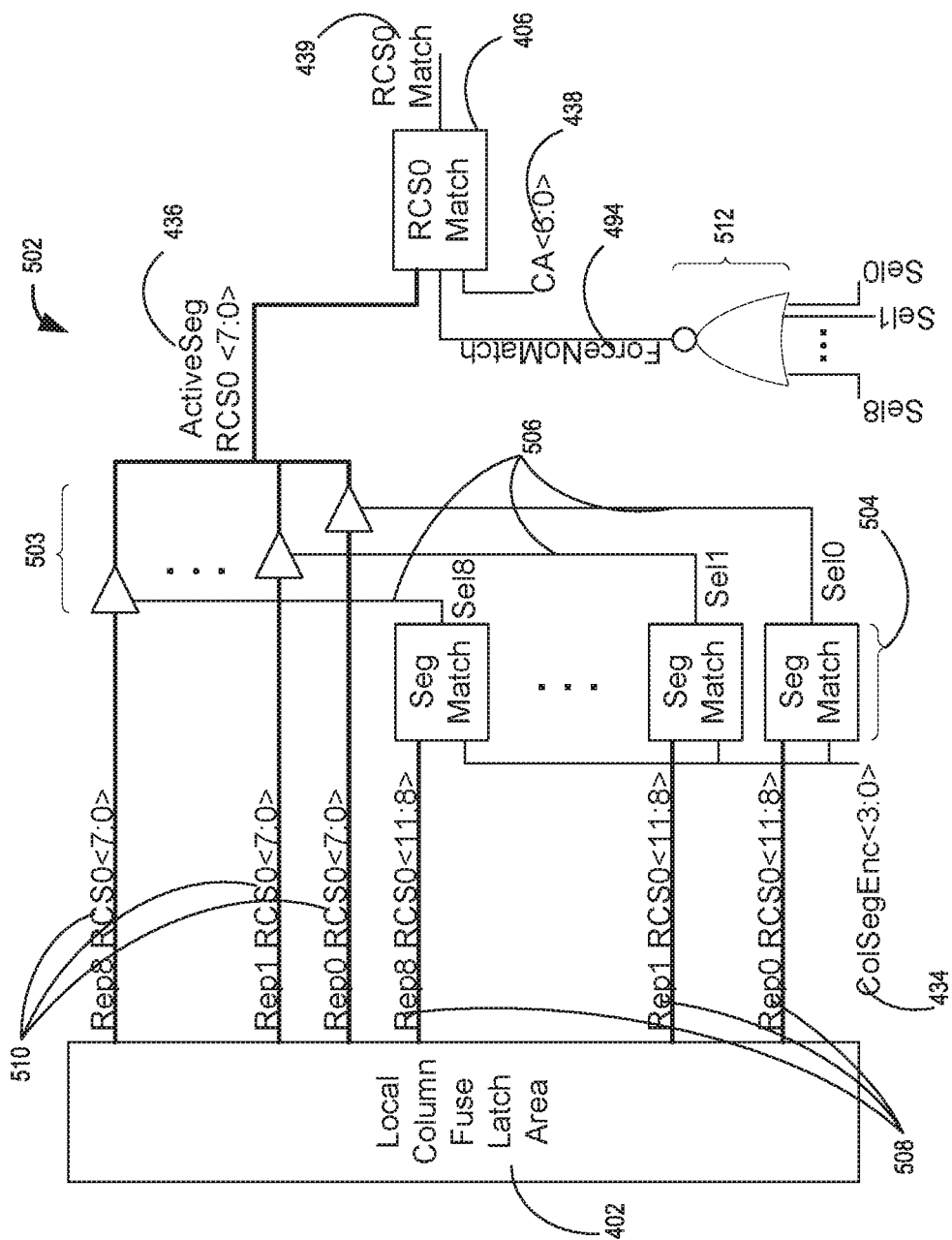
FIG. 5A is a detailed block diagram of a segment-address determination circuit in accordance with an embodiment of the present technology.

FIG. 5A is a detailed block diagram of a segment-address determination circuit (e.g., a control circuit 502, such as for the segment-address determination circuit 404, the comparator circuitry 406, and/or portions thereof illustrated in FIG. 4A) in accordance with an embodiment of the present technology. The control circuit 502 is configured to control an assignment or a repair using a redundant column (e.g., RCS0). The control circuit 502 can be configured to leverage encoded column segmentation (ECS) schemes in which the segment is encoded and fuse-backed in each column repair fuse set. The control circuit 502 can compare the fused segment of each repair to the accessed segment after an activate command.

Due to varying digit-line lengths, a number of segments per region may be non-binary, which may result in unused decodes from the segment fuses that do not line up with a physical segment. New decodes may be added when the number of segments is binary. The memory device 200 of FIG. 2 and/or the control circuit 502 can be configured to use one or more of the unused decodes to indicate (via, e.g., corresponding fuse settings or CAs) a defective full column select. The defective full column select can correspond to a defect that spans many sections and segments in a higher level of metal over the array. The unused decodes can indicate the defective full column select instead of a defective digit-line or local column select, such as for a defect that spans at most two sections or segments in the array.

As discussed in detail below, the control circuit 502 can include logic to positively match when the fused segment address is blown to a decode corresponding to the defective full column select, such as for responding to the higher-level defect. The control circuit 502 can include the logic that positively matches when the fused segment address matches the activated segment address and/or when the fused segment address is blown to a decode reserved for full column repair. The control circuit 502 can allow the reserved decode to match on any segment and remove limitations of that directly tie one repair to a single row space. The control circuit 502 can include segment match circuits 504 (e.g., comparator circuitry) that each receives the column segment identifier 434 (ColSegEnc<3:0>, e.g., an output of a column-row segment selection circuit (CRSegSelect)) and one repair segment locator 508 (e.g., one of Rep0 RCS0 <11:8>-Rep8 RCS0 <11:8> for RCS0 that correspond to a defective memory location and/or the reserved decode. One of the repair segment locators 508 can correspond to the reserved decode that corresponds to the defective full column select, such as for responding to/repairing the higher-level defect. Each of the segment match circuits 504 can generate a unique selection signal 506 that indicates whether the received repair segment locator 508 matches the column segment identifier 434.

The control circuit 502 can include buffers 503 for controlling an assignment or a repair using a redundant column (e.g., RCS0). The buffers 503 can be configured to generate the active segment address 436 according to the selection signals 506. Each of the buffers 503 can receive one of repair addresses 510 and be controlled by one of the selection signals 506. Accordingly, the buffers 503 can generate the active segment address 436 based on releasing or transmitting one or more of the repair addresses according to the selection signals 506. In other words, the segment match circuits 504 can identify which of the repair segment locator 508 corresponds to the current read/write address and generate the selection signals 506 accordingly. The buffers 503 can transmit one of the repair addresses 510 that matches the repair segment locator 508 indicated by the selection signal 506.

The control circuit 502 can include one or more portions/aspects similar to those of control circuits (e.g., the control circuit 470 of FIG. 4D and/or the control circuit 490 of FIG. 4E). For example, the control circuit 502 can include the comparator circuitry 406 that receives the active segment address 436 (ActiveSeg RCS0 <7:0>) and compare it with the read/write column address 438 (CA<6:0>). Based on the comparison, the comparator circuitry 406 can generate the match flag 439 for the redundant column (e.g., RCS0). The control circuit 502 may also include a repair disable circuit 512 that generates a no match signal 494 according to the selection signals 506. The repair disable circuit 512 can be similar to the repair disable circuit 474 of FIG. 4D and/or the repair disable circuit 492 of FIG. 4E, but provide a separate signal (the no match signal 494) instead of providing the default disabled repair address 476 of FIG. 4D as the active segment address 436. For example, the repair disable circuit 512 can be a NOR gate that generates the no match signal 510 as a NOR of the selection signals 506. The no match signal 494 can indicate the no match case to the comparator circuitry 406. Accordingly, the comparator circuitry 406 can deactivate the match flag 439 to indicate the no match based on an active state of the no match signal 494, independent of the active segment address 436.

The segment match circuits 504 and/or the repair disable circuit 512 provide reduced resources and reduced circuit foot print for the memory device 200 2. The number and/or size of the multiplexer, routing, and the logic associated with the fuse latch sets can be reduced along with the reduction in the number of fuse latch sets. Using the examples discussed above (e.g., for FIG. 3A and FIG. 4A), the segment match circuits 504 and/or the repair disable circuit 512 can reduce the number and/or size of the multiplexer, routing, and the logic. For example, the segment match circuits 504 and/or the repair disable circuit 512 can reduce the resources for routing and logic by reducing the routing/muxing of column fuse sets from 10:1 to 4:1. Additionally, the control circuit 502 can implement repairs for full column/global column defects using fewer (e.g., one) repair fuse set and/or fewer full RCSs. In comparison (i.e., without the control circuit 502), repairs for full column/global column defects may use every repair fuse set, leaving none for any other hard column defects or single bits. As such, the control circuit 502 provides improved yield benefits and reduced foot print resulting from the reduced fuse sets. Further, for ECS schemes, the control circuit 502 can make the repair usage the same as conventional non ECS schemes.

Figure 5B:
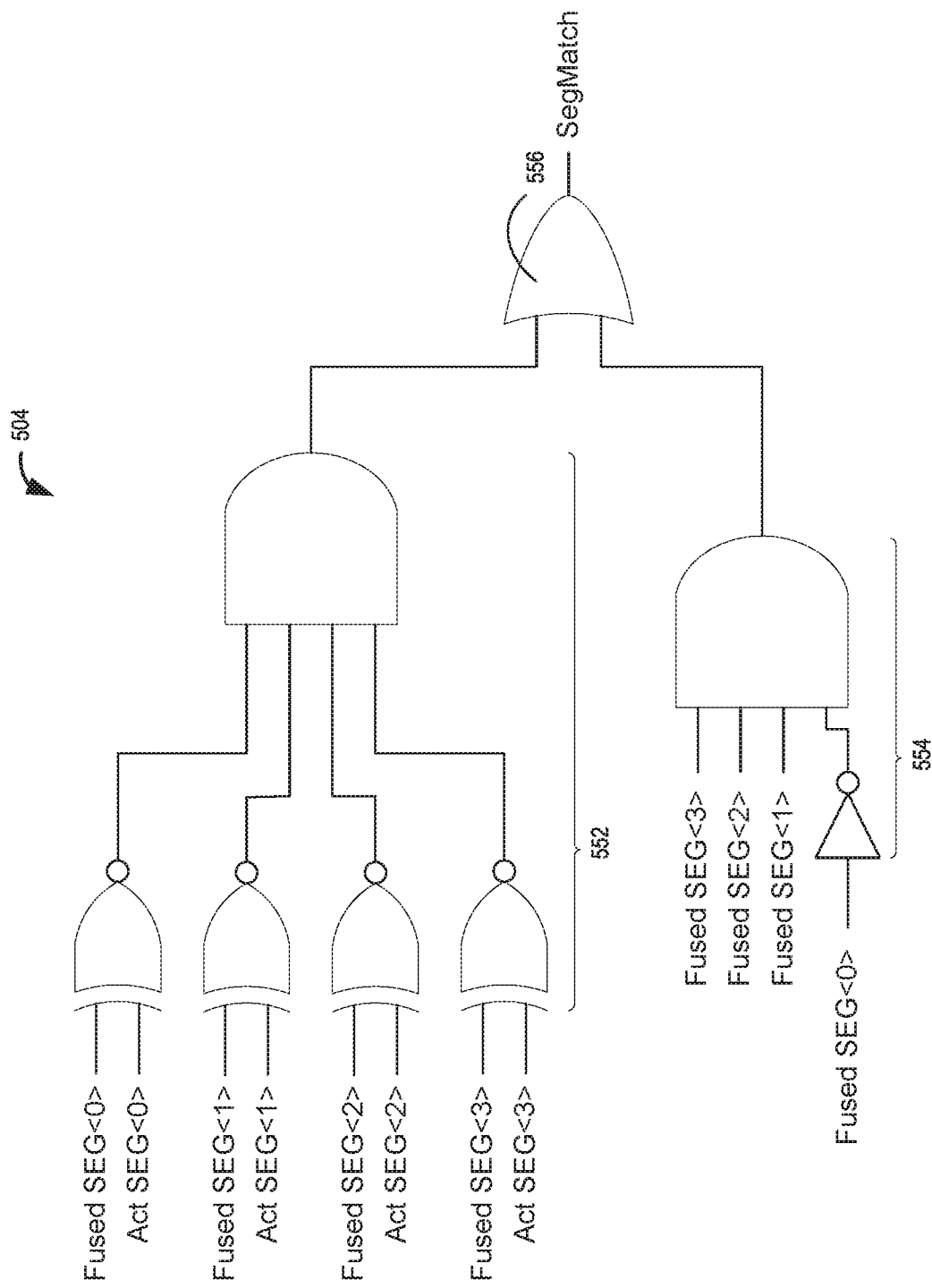
FIG. 5B is an example block diagram of a segment match circuit in accordance with an embodiment of the present technology.

FIG. 5B is an example block diagram of a segment match circuit (e.g., one of the segment match circuits 504) in accordance with an embodiment of the present technology. In some embodiments, the column region may be divided into 13 column segments. As such, four bits may be used to decode one of the 13 segments targeted for repair, thereby leaving unused decodes (e.g., three decodes corresponding to a difference between 13 segments and 16 available 4-bit values). One or more of the remaining unused decodes (e.g., '0000' and '1111') may be used to indicate whether the repair is unused or disabled. One of the remaining unused decodes (e.g., '1110') may be used to indicate the related fused CAs address a full column defect, where every segment needs to be activated.

The segment match circuit 504 can include a segment portion 552 (e.g., circuit/logic) configured to determine whether the column segment identifier 434 of FIG. 5A matches the repair segment locator 508 of FIG. 5A. In some embodiments, the segment portion 552 can be configured to implement a bit-by-bit comparison between the column segment identifier 434 (Act SEG <0>-Act SEG <3>) and the repair segment locator 508 (Fused SEG <0>-Fused SEG <3>). For example, the segment portion 552 can include exclusive NOR gates (XNOR) that each compare corresponding bits of the column segment identifier 434 and the repair segment locator 508. Outputs of the XNORs can be provided to a logical AND to determine whether the column segment identifier 434 matches the repair segment locator 508.

The segment match circuit 504 can further include a full-column defect portion 554 (e.g., circuit/logic) configured to determine whether the repair segment locator 508 matches the decode reserved for activating every segment. For example, the full-column defect portion 554 may include one or more inverters corresponding to the reserved decode value and a logical AND configured to detect when the repair segment locator 508 matches the reserved decode value. For the example illustrated in FIG. 5B, the reserved decode value can correspond to '1110.' As such, the full-column defect portion 554 can include an inverter for Fused SEG <0>. Accordingly, when the repair segment locator 508 matches the reserved decode value, the corresponding logical AND of the column defect portion 554 can generate a logical '1' that indicates the match.

The segment match circuit 504 can include a combining portion 556 (e.g., a logical OR) configured to compare the above-described comparison results (e.g., outputs from the segment portion 552 and the full-column defect portion 554, such as the corresponding logical ANDs). The output (SegMatch) of the combining portion 556 can identify whether the column segment identifier 434 matches the repair segment locator 508 and/or whether the repair segment locator 508 matches the decode reserved for activating every segment. The SegMatch output can correspond to the selection signal 506 of FIG. 5A.

Figure 6:
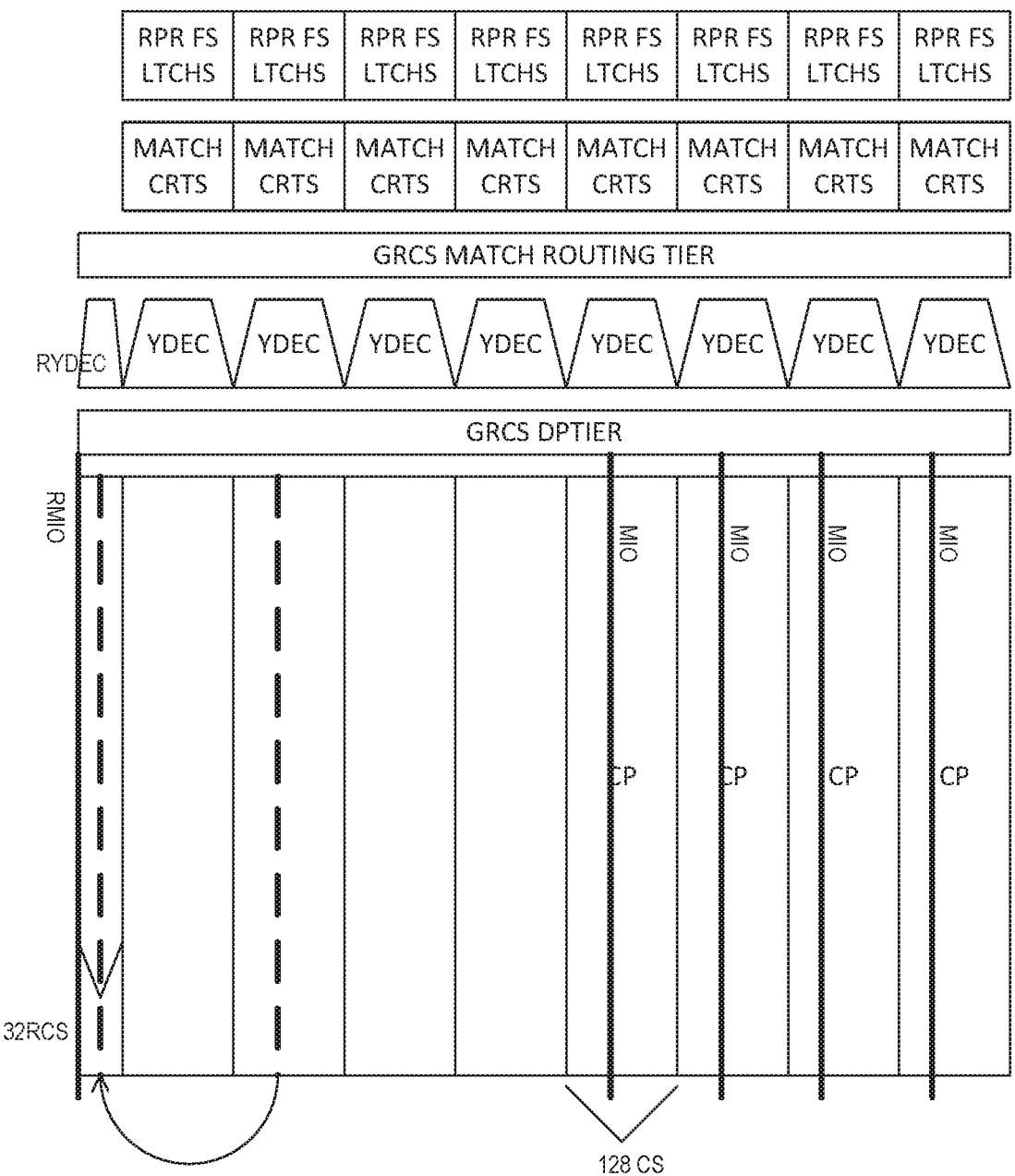
FIG. 6 is a block diagram of a portion of the memory device of FIG. 2 in accordance with an embodiment of the present technology.

FIG. 6 is a block diagram of a portion of the memory device 200 of FIG. 2 in accordance with an embodiment of the present technology. FIG. 6 illustrates an example of repairs for the regional plane 410 of FIG. 4 using the redundant memory 414 of FIG. 4 and/or the repair planes 415 of FIG. 4. FIG. 6 illustrates repair fuse latches that may correspond to the local fuse latch area 402 of FIG. 2 or portions therein and/or match circuits that may correspond to the segment-address determination circuits 404 of FIG. 4A and the comparator circuitry 406 of FIG. 4B.

For global column repair schemes, the columns (e.g., the redundant memory 414) can be located in a separate column plane (e.g., the repair planes 415) and separate from the main array column plane (e.g., the regional plane 410). In some embodiments (e.g., for DDR4), global column repair scheme can include the redundant column plane as a separate subarray (e.g., illustrated on the left, RYD ED) that is parallel to the other main array column planes. For the example illustrated in FIG. 6, the dashed lines can represent one repair can be mapped to a separate redundant column plane. One such repair may be available per x8 region.

Figure 7:
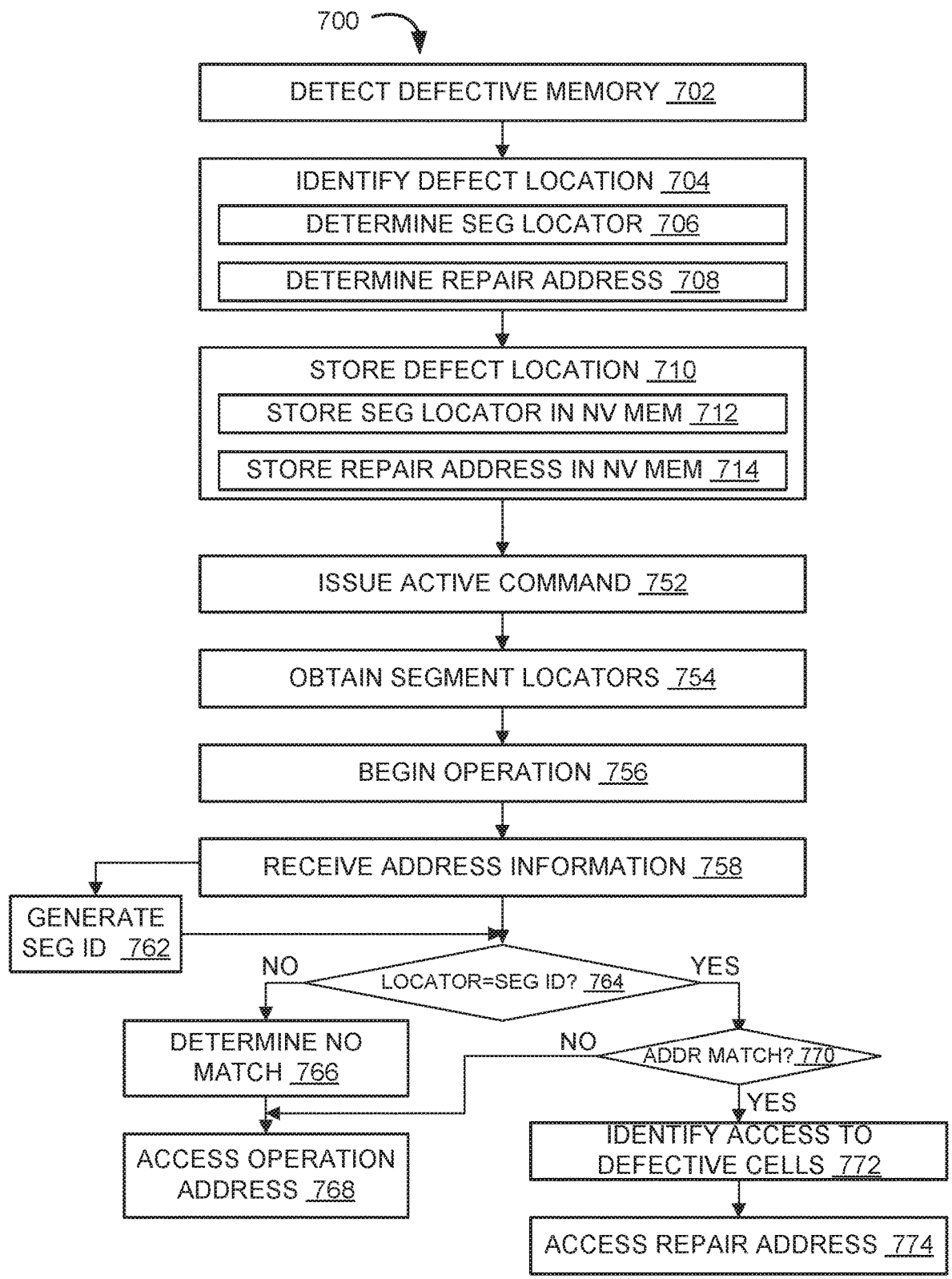
FIG. 7 is a flow diagram illustrating an example method of operating an apparatus in accordance with an embodiment of the present technology.

FIG. 7 is a flow diagram illustrating an example method 700 of operating an apparatus (e.g., the memory device 200 of FIG. 2) in accordance with an embodiment of the present technology. For example, the method 700 can be for operating the local fuse latch area 402 of FIG. 4A, the segment-address determination circuits 404 of FIG. 4A, and/or the comparator circuitry 406 of FIG. 4A for replacing one or more defective memory cells with redundant memory cells according to the repair addresses 422 of FIG. 4A and the repair segment locators 424 of FIG. 4A and/or the repair segment locator 508 of FIG. 5A and the repair addresses 510 of FIG. 5B. The method 700 can effectively or functionally couple (i.e., without or in place of direct one-to-one connections) the fuses and/or the fuse latches used for the repair addresses 422/510 to the redundant memory 414 of FIG. 4.

Figure 1:
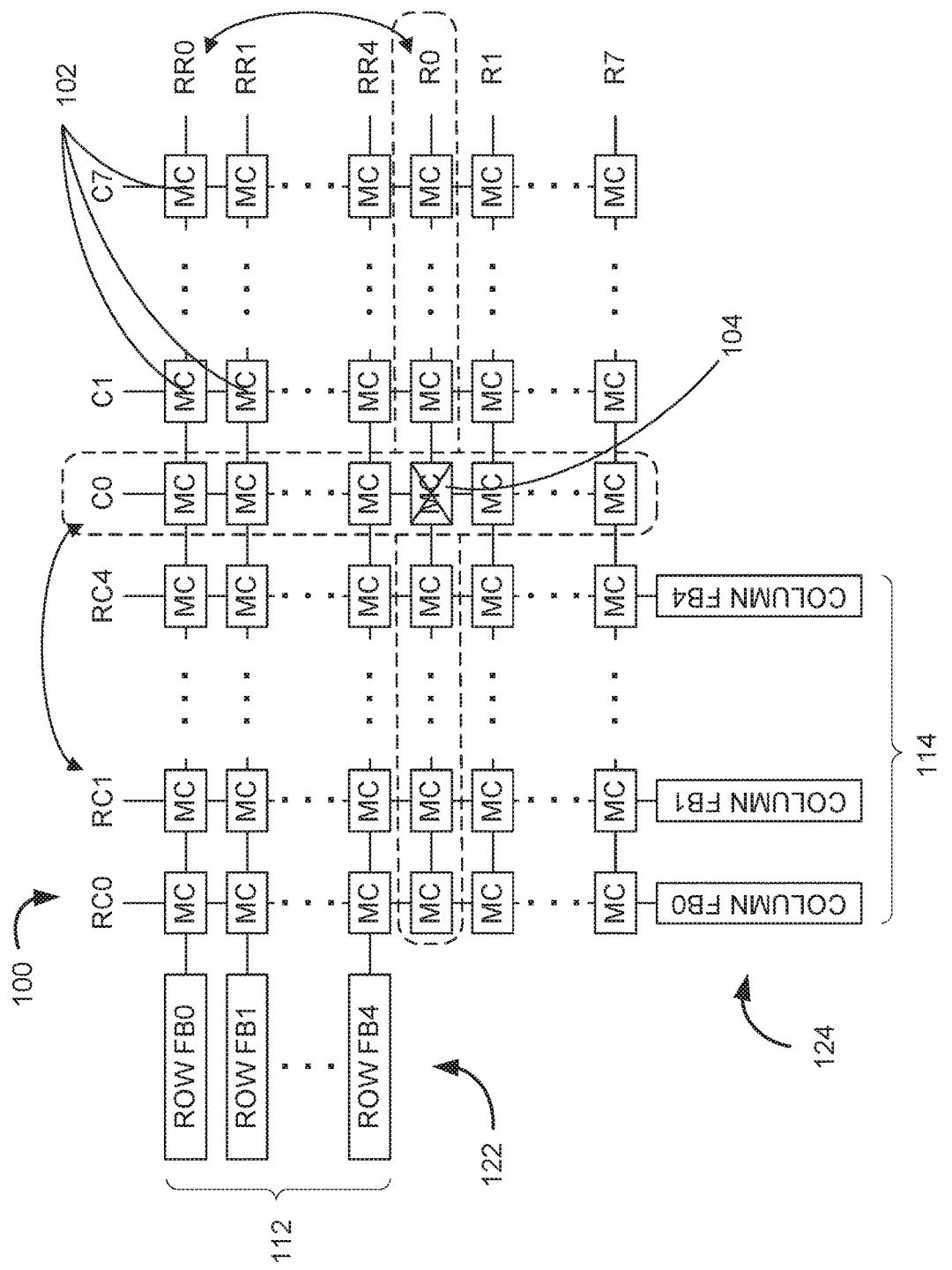
FIG. 1 is a partial block diagram of a memory device including a set of repairable memory cells.

At block 702, the memory device 200 can detect defective memory (e.g., the defective cells 104 of FIG. 1). In some embodiments, the memory device 200 can implement a built-in self-test (BIST), which can be on-line and/or off-line, to test the memory cells (e.g., the memory array 250 of FIG. 2). For example, the memory device 200 can execute a test sequence (via, e.g., a memory controller, a finite state machine, and/or a processor) using a predetermined sequence of test elements that include memory operations, data patterns, and/or addresses. To test, the memory device 200 can write the predetermined data patterns to the corresponding addresses and then read the same addresses to confirm the same data pattern. When the read pattern does not match the predetermined written data pattern, the memory device 200 can identify the memory cells corresponding to the difference as being defective.

At block 704, the memory device 200 can identify the defect location (e.g., the locations of the defective memory cells). For example, the memory device 200 can identify the internal addresses of the defective memory cells. Using a predetermined table and/or a predetermined process, the memory device 200 can identify the segment 412 of FIG. 4A, the regional plane 410 of FIG. 4A, the column, and/or the row the within the memory array 250 that includes the one or more defective memory cells.

At block 706, the memory device 200 can determine a segment locator (e.g., the repair segment locator 424 and/or the repair segment locator 508) that identifies the segment 412 within the regional plane 410 of FIG. 4A, such as for the column segment within the column plane. The memory device 200 can determine the segment locator associated with the identified segment 412 and/or the regional plane 410 including the defective memory cells. Also, for global repairs, the memory device 200 can determine the segment locator that identifies the regional plane 410 that is swapped out. At block 708, the memory device 200 can determine a repair address (e.g., the address of a column including the defective memory cells, such as the repair address 422 and/or the repair address 510) for the defective memory cells. For global repairs, the memory device 200 can determine the repair address that identifies the repair planes 415 of FIG. 4.

At block 710, the memory device 200 can store the defect locations for repairing the defective memory cells. The memory device 200 can store the defect locations, such as by setting fuses and/or writing to other non-volatile memory. In storing the defect locations, the memory device 200 can store both the repair address 422/510 and the repair segment locator 424/508 for each defective memory cell or each grouping thereof. For example, at block 712, the memory device 200 can store the repair segment locator 424/508 in a first set of fuses associated with the regional plane 410 (e.g., column plane or a bank) that includes the column/row having the defective cells therein. Also, at block 714, the memory device 200 can store the repair address 422/510 in a second set of fuses that is paired with the first set of fuses and associated with the regional plane 410.

The stored location information of the defective memory cells can be used for repairs, such as by accessing/utilizing redundant memory cells in place of the defective memory cells. As an illustrative example, the memory device 200 can load the stored repair addresses 422/510 and the stored repair segment locator 424/508 into the corresponding latches (e.g., the latches in the local fuse latch area 402 of FIG. 4A) during initialization or power reset. When memory operations reference columns, rows, and/or planes including the defective memory cells, the memory device 200 can use or access the redundant columns, rows, and/or planes associated with the defective memory cells.

At block 752, the memory device 200 can issue an active command (ACT). Based on the active command, the memory device 200 can activate an idle bank, thereby causing a read of that row into the bank's array of column sense amplifiers. In other words, the memory device 200 can issue the active command to open the row.

At block 754, the memory device 200 can obtain segment locators (e.g., the stored repair segment locator 424/508). The memory device 200 can use the segment locators to access/obtain the repair addresses (e.g., the stored repair addresses 422/510). The memory device 200 can obtain the repair information based on loading the information from the first and second paired fuse sets into the corresponding fuse latches (e.g., receiving and/or recalling the broadcasted information) as described above. Also, the memory device 200 can obtain the information based on providing the latched information to the subsequent circuits, such as the segment match circuits 432 of FIG. 4B, the segment match circuits 452 of FIG. 4C/4D/4E, the multiplexer 456 of FIG. 4C, the segment match circuits 504 of FIG. 5A, the buffers 472 of FIG. 4D/4E, and/or the buffers 503 of FIG. 5A.

At block 756, the memory device 200 can begin implementing an operation (e.g., a read or a write operation) in response to a command from a host. At block 758, the memory device 200 can receive an operation address (e.g., a read or a write address) associated with the operation. For example, the memory device 200 can determine the column address (e.g., the read/write column address 438 of FIG. 4B) associated with the commanded operation.

At block 762, the memory device 200 can generate the segment identifiers (e.g., the column segment identifier 434 of FIG. 4B) associated with the operation address. For example, the memory device 200 can supply the active row address to the CRSegSelect circuit of FIG. 4A, which can generate the column segment identifier 434 as described above. In some embodiments, the memory device 200 can generate the segment identifiers after or in parallel with accessing the repair information. For global repairs, the memory device 200 can similarly generate the segment identifiers that identify the active region (column plane) associated with the operation.

At decision block 764, the memory device 200 (e.g., the segment match circuits 452) can determine whether the repair segment locator 424/508 matches the column segment identifier 434. In other words, the memory device 200 can determine whether the commanded operation is associated with a segment that includes defective/swapped cells. In some embodiments, the memory device 200 can use the segment match circuits to compare the repair segment locator 424/508 with the column segment identifier 434.

When the repair segment locator 424/508 does not match the column segment identifier 434, such as illustrated at block 766, the memory device 200 can determine a no match scenario. In some embodiments, the memory device 200 can use the repair disable circuit 474 of FIG. 4D, the repair disable circuit 492 of FIG. 4E, and/or the repair disable circuit 512 of FIG. 5A to determine the no match scenario. For example, the memory device 200 can determine the no match scenario based on analyzing the results of the location comparison (via, e.g., applying a NOR to the selection signals 454 of FIG. 4C/4D/4E and/or the selection signals 506 of FIG. 5A). In some embodiments, the segment-address determination circuit 404 (e.g., the repair disable circuit 474) can generate the active segment address 436 of FIG. 4D including the default disabled repair address 476 of FIG. 4D. In some embodiments, the repair disable circuit 492/512 can generate the no match signal 494 of FIG. 4E/5A to notify the comparator circuitry 406 of the no match scenario. Accordingly, the comparator circuitry 406 can generate the corresponding match flag 439 of FIG. 4B (having e.g., inactive state or value).

At block 768, the memory device 200 can access the operation address (e.g., the read/write column address 438) for the read/write operation based on the resulting match flag 439. Since the operation address is for a segment that does not include defective/repaired memory cells as indicated by the comparison, the memory device 200 can execute the memory operation utilizing the originally referenced location.

When the repair segment locator 424 matches the column segment identifier 434, such as illustrated at decision block 770, the memory device 200 can determine whether the address (e.g., the active segment address 436) matches the operation address (e.g., the read/write column address 438). In some embodiments, the segment-address determination circuit 404 can generate the active segment address 436 when the repair segment locator 424/508 matches the column segment identifier 434. The segment-address determination circuit 404 (e.g., the segment match circuits 432/452/504, the multiplexer 456, and/or the buffers 472/503) can generate the active segment address 436 based on transmitting the repair addresses 422/510 that is paired with the repair segment locator 424/508 matching the column segment identifier 434. The comparator circuitry 406 can compare the active segment address 436 to the operation address and generate the match flag 439 accordingly.

When the active segment address 436 does not match the operation address (i.e., the read/write operation involves a non-defective set of memory cells and the match flag 439 is inactive), the memory cells can access the operation address as described above for block 768. Otherwise (i.e., when the match flag 439 is activated), the memory device 200 can identify access to defective/repaired memory cells via the match flag 439. At block 774, the memory device 200 (e.g., a column decoder and/or a row decoder) can access the active segment address 436 (i.e., the repair address 422/510) for the read/write operation instead of the intended operation address. In other words, based on an active setting of the match flag 439, the memory device 200 implement the repair by accessing the redundant column or plane instead of the intended column or plane that includes the defective/replaced memory cells.

As described above, the method 700 functionally couples the address latches to redundant rows/columns/planes that are not directly connected via the repair segment locator 424/508 and the segment-address determination circuit 404. Accordingly, the number of repairs and the corresponding number of fuses/fuse latches can be decoupled from the number of sections, thereby reducing the second measure 428 of FIG. 4A and the total number of fuses/fuse latches as described above. The reduction in the number of total fuses/fuse latches provides smaller circuit foot print, reduced cost, and increased efficiency for the memory device 200.

Figure 8:
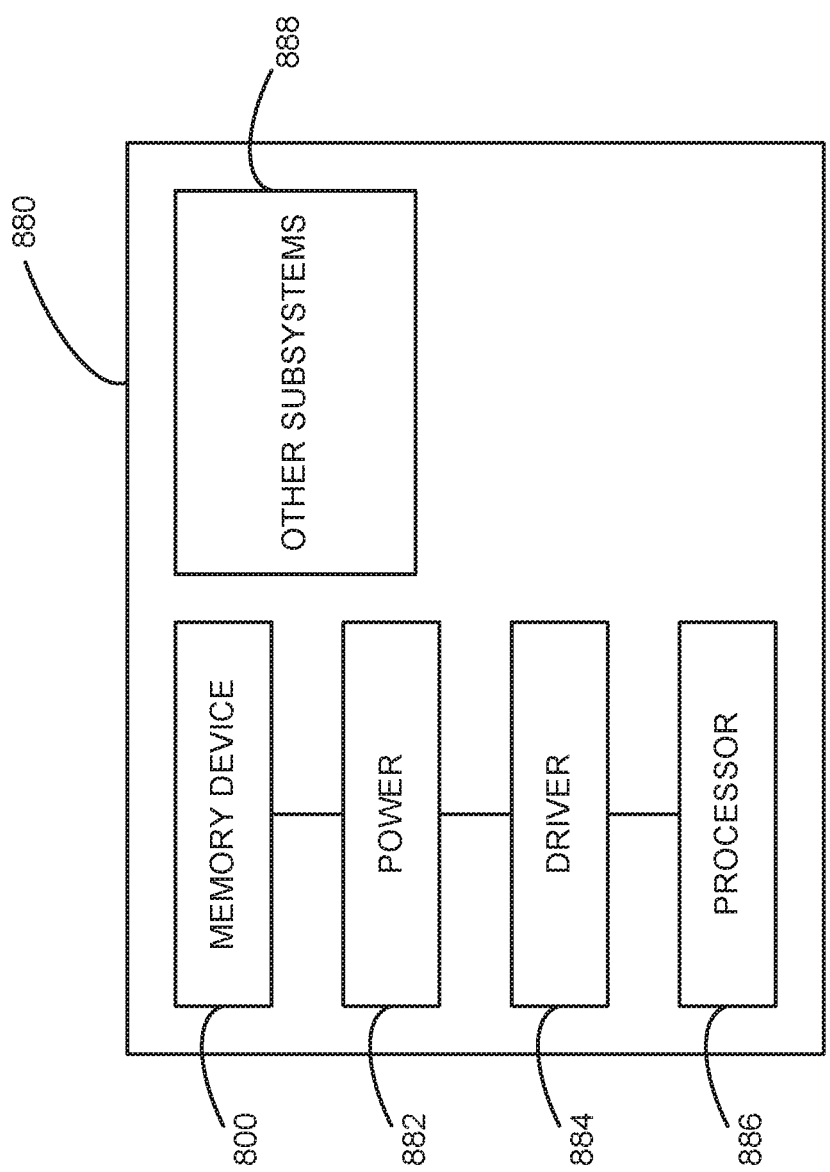
FIG. 8 is a schematic view of a system that includes an apparatus in accordance with an embodiment of the present technology.

FIG. 8 is a schematic view of a system that includes an apparatus in accordance with embodiments of the present technology. Any one of the foregoing apparatuses (e.g., memory devices) described above with reference to FIGS. 2-7 can be incorporated into any of a myriad of larger and/or more complex systems, a representative example of which is system 880 shown schematically in FIG. 8. The system 880 can include a memory device 800, a power source 882, a driver 884, a processor 886, and/or other subsystems or components 888. The memory device 800 can include features generally similar to those of the apparatus described above with reference to FIGS. 2-7, and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 2-8.

We claim:

1. A memory device, comprising:
   a memory array including a plurality of memory cells and a plurality of redundant cells configured to replace one or more defective memory cells in the plurality of memory cells;
   a set of locator latches configured to latch a repair segment locator representing a segment within the memory array that includes the one or more defective memory cells;
   a set of address latches configured to latch a repair address representing a location of the one or more defective memory cells within the segment;
   a segment-address determination circuit coupled to the set of locator latches and the set of address latches, the segment-address determination circuit configured to generate an active segment address based on the repair address according to the repair segment locator and at least a portion of an address for an operation; and
   a comparator circuitry coupled to the segment-address determination circuit and configured to determine whether the active segment address matches the address for the operation for replacing the one or more defective memory cells with the plurality of redundant cells when the address for the operation corresponds to the one or more defective memory cells.

2. The memory device of claim 1, wherein the set of address latches is selectively coupled to multiple redundant column segments within the plurality of redundant cells.

3. The memory device of claim 1, further comprising:
a set of local fuse latches configured to latch one or more segment locators and one or more corresponding addresses, wherein the one or more segment locators include the repair segment locator and the one or more corresponding addresses include the repair address;
wherein the segment-address determination circuit is configured to:
receive from the set of local fuse latches one or more pairings that each include one segment locator and a corresponding address;
receive a segment identifier representing the segment associated with the address for the operation;
compare the one or more segment locators to the segment identifier; and
generate the active segment address as the repair address that is paired with the repair segment locator matching the segment identifier.

4. The memory device of claim 3, wherein the segment-address determination circuit includes one or more segment match circuits, wherein each of the one or more segment match circuits is configured to:
receive a unique pair of the segment locator and the corresponding address;
receive the segment identifier; and
output the address as the active segment address when the segment locator matches the segment identifier.

5. The memory device of claim 3, wherein the segment-address determination circuit includes:
one or more segment match circuits, wherein each of the one or more segment match circuits is configured to:
receive a segment locator,
receive the segment identifier, and
generate a selection signal representing whether the received segment locator matches the segment identifier; and
a multiplexer coupled to each of the one or more segment match circuits, the multiplexer configured to:
receive the selection signal from each of the one or more segment match circuits,
receive the addresses corresponding to the segment identifiers, and
output one of the addresses as the active segment address according to the received selection signals, wherein the one of the addresses is paired with the segment locator matching the segment identifier.

6. The memory device of claim 3, wherein the segment-address determination circuit includes:
one or more segment match circuits, wherein each of the one or more segment match circuits is configured to:
receive a segment locator,
receive the segment identifier, and
generate a selection signal representing whether the received segment locator matches the segment identifier; and
one or more buffers, wherein each of the buffers is coupled to a unique one of the one or more segment match circuits and is configured to:
receive the selection signal from the coupled segment match circuit,
receive an address paired with the segment locator received at the coupled segment match circuit, and
output the address as the active segment address when the selection signal indicates a match between the paired segment locator and the segment identifier.

7. The memory device of claim 6, wherein the one or more segment match circuits are configured to generate the selection signal representing whether the segment locator matches a reserved decode for a defective full column select representative of defects that span multiple sections and/or segments in the memory array.

8. The memory device of claim 7, wherein the memory array is configured according to an encoded column segmentation (ECS) scheme for encoding and providing segments in each column repair fuse set.

9. The memory device of claim 7, wherein each of the one or more segment match circuits include:
a segment portion configured to:
receive the segment locator and the segment identifier, and
determine whether the received segment locator matches the segment identifier;
a full-column defect portion configured to determine whether the segment locator matches the reserved decode; and
a combining portion coupled to the segment portion and the full-column defect portion, the combining portion configured to generate the selection signal when the received segment locator matches the segment identifier or when the segment locator matches the reserved decode.

10. The memory device of claim 9, wherein the full-column defect portion includes:
a number of inverters corresponding to the reserved decode; and
a logical AND configured to generate a match signal according to the segment locator or a portion thereof and/or outputs from the number of inverters.

11. The memory device of claim 3, wherein:
the segment-address determination circuit includes one or more segment match circuits, wherein each of the one or more segment match circuits is configured to:
receive a segment locator,
receive the segment identifier, and
generate a selection signal representing whether the received segment locator matches the segment identifier; and
further comprising a repair disable circuit coupled to the comparator circuitry and configured to:
receive a set of selection signals that include the selection signal from each of the segment match circuits,
determine a no match case based on the selection signals when the set of selection signals does not match the segment identifier, and
generate the active segment address including a default address for the no match case, wherein the default address does not match the paired addresses.

12. The memory device of claim 11, wherein the repair disable circuit includes:
a NOR gate configured to receive set of selection signals and determine the no match case; and
a buffer controlled by an output of the NOR gate, the buffer configured to:
receive the default address, and
transmit the default address when the output of the NOR gate indicates the no match case.

13. The memory device of claim 3, wherein:
the segment-address determination circuit includes one or more segment match circuits, wherein each of the one or more segment match circuits is configured to:
receive a segment locator,
receive the segment identifier, and generate a selection signal representing whether the received segment locator matches the segment identifier; and further comprising a repair disable circuit coupled to the comparator circuitry and configured to:
- receive a set of selection signals that include the selection signal from each of the segment match circuits,
- determine a no match case based on the selection signals when the set of selection signals does not match the segment identifier, and
- generate a no match signal for the no match case, wherein the no match signal is separate from the active segment address and indicates the no match case for the comparator circuitry.

14. The memory device of claim 13, wherein the repair disable circuit is a NOR gate configured to receive the set of selection signals and provide the no match signal directly to the comparator circuitry separate from the active segment address.

15. The memory device of claim 1, wherein:
the active segment address includes an enable segment configured to indicate whether the corresponding repair address has been enabled to implement a repair; and
the segment-address determination circuit is configured to precharge a connection associated with the enable segment for disabling a redundant memory selection for a no match case.

16. The memory device of claim 1, wherein:
the plurality of memory cells and the plurality of redundant cells are grouped into regions that each include a plurality of segments having multiple memory cells and multiple groupings of redundant cells therein; and
further comprising:
a fuse latch area coupled to each of the regions, wherein the fuse latch area includes multiple pairs of a set of locator latches and a corresponding set of address latches, wherein:
each pair represents a repair, and
a number of the repairs for the region is less than a product of a number of segments in the region and a number of groupings of the redundant cells.

17. The memory device of claim 16, wherein:
the fuse latch area corresponds to a first dimension and a second dimension, the first dimension representing the number of repairs and a second dimension representing a combined number of bits for the repair segment locator and the repair address; and
the fuse latch area includes a total number of latches corresponding to a product of the first dimension and the second dimension, wherein the total number of latches is less than a product of the number of segments in the region, the number of groupings of the redundant cells, and a number of bits for the repair address.

18. The memory device of claim 16, wherein:
the region is a column plane;
at least a portion of the plurality of redundant cells correspond to a redundant column;
the repair segment locator represents a column segment;
the repair address is an address of a column that is within the column segment and includes the one or more defective memory cells; and
the comparator circuitry is coupled to a column decoder and configured to notify the column decoder when the address for the operation matches the address of the column for a column repair that utilizes the redundant column for the operation instead of the column including the one or more defective memory cells.

19. The memory device of claim 1, wherein:
the memory array includes the plurality of memory cells grouped into memory planes and redundant cells grouped into one or more repair planes;
the set of locator latches is configured to latch the repair segment locator representing one of a plurality of memory arrays;
the set of address latches is configured to latch the repair address representing one of the memory planes that includes the one or more defective memory cells; and
the comparator circuitry is configured to determine whether the active segment address matches the address for the operation for replacing the one of the memory planes including the one or more defective memory cells with the one of the redundant planes for a global repair.

20. The memory device of claim 19, wherein the memory planes are column planes.

21. The memory device of claim 1, wherein the memory device is a dynamic random-memory (DRAM) device.

22. A method of operating a memory device that includes a plurality of memory cells and a plurality of redundant cells configured to replace one or more defective memory cells in the plurality of memory cells, the method comprising:
obtaining a repair segment locator representing a segment within the memory array that includes the one or more defective memory cells;
obtaining a repair address representing a location of the one or more defective memory cells within the segment;
receiving an operating address for a read or a write operation;
using a segment-address determination circuit, generating active segment address based on the repair address according to the repair segment locator and at least a portion of the operating address; and
replacing the one or more defective memory cells when the active segment address matches the operating address, wherein the one or more defective memory cells are replaced using the plurality of redundant cells when an address for the read/write operation corresponds to the one or more defective memory cells.

23. The method of claim 22, further comprising:
detecting the one or more defective memory cells;
identifying the segment within the memory array that includes the one or more defective memory cells;
determining the repair segment locator associated with the identified segment;
storing the repair segment locator in a first set of fuse latches;
determining an address associated with the defective memory cells; and
storing the address as the repair address in a second set of fuse latches that is paired with the first set of fuse latches.

24. The method of claim 22, wherein providing the repair address as the active segment address includes functionally coupling the set of address latches to the plurality of the redundant cells according to the repair segment locator.

* * * * *